United States Patent
Mikami et al.

(10) Patent No.: US 7,928,647 B2
(45) Date of Patent: Apr. 19, 2011

(54) COMPOSITE EMITTING DEVICE

(75) Inventors: Akiyoshi Mikami, Kanazawa (JP);
Hitoshi Kuma, Sodegaura (JP)

(73) Assignees: Akiyoshi Mikami, Kanazawa-shi (JP);
Idemitsu Kosan Co., Ltd., Tokyo (JP)

( * ) Notice: Subject to any disclaimer, the term of this patent is extended or adjusted under 35 U.S.C. 154(b) by 57 days.

(21) Appl. No.: 12/414,841

(22) Filed: Mar. 31, 2009

(65) Prior Publication Data

US 2009/0236968 A1    Sep. 24, 2009

Related U.S. Application Data

(63) Continuation of application No. 11/376,128, filed on Mar. 16, 2006, now Pat. No. 7,583,021.

(51) Int. Cl.
*H01L 51/52* (2006.01)

(52) U.S. Cl. .......... 313/501; 313/504

(58) Field of Classification Search .......... 257/40, 257/72, 98–100, 642–643, 759; 313/498–512; 315/169.1, 169.3; 427/58, 64, 66, 532–535, 427/539; 428/690–691, 917; 438/26–29, 438/34, 82; 445/24–25

See application file for complete search history.

(56) References Cited

U.S. PATENT DOCUMENTS

| | | | |
|---|---|---|---|
| 6,117,529 A * | 9/2000 | Leising et al. | 428/209 |
| 6,936,960 B2 | 8/2005 | Cok | |
| 7,057,339 B2 | 6/2006 | Boroson et al. | |
| 2003/0168972 A1 * | 9/2003 | Hamada et al. | 313/504 |
| 2004/0108818 A1 * | 6/2004 | Cok et al. | 315/169.3 |
| 2004/0265622 A1 * | 12/2004 | Sadasivan et al. | 428/690 |
| 2006/0267001 A1 * | 11/2006 | Hung | 257/40 |

* cited by examiner

*Primary Examiner* — Nimeshkumar D Patel
*Assistant Examiner* — Donald L Raleigh
(74) *Attorney, Agent, or Firm* — Oblon, Spivak, McClelland, Maier & Neustadt, L.L.P.

(57) ABSTRACT

A composite emitting device including: a supporting substrate, a first emitting part comprising a first electrode, a luminescent medium, and a second electrode stacked in this order on the supporting substrate, and a second emitting part including a fluorescent film arranged in a direction different from the light-out coupling direction relative to the luminescent medium, the luminescent medium emitting light by applying a voltage between the first electrode and the second electrode in the first emitting part, and the fluorescent film of the second emitting part absorbing light emitted from the luminescent medium to emit light.

22 Claims, 7 Drawing Sheets

(a)

(b)

(c)

COMPOSITE EMITTING DEVICE

TECHNICAL FIELD

The invention relates to a composite emitting device used for a display or the like. More particularly, the invention relates to a composite emitting device including an organic electroluminescent (EL) device.

BACKGROUND ART

In a known display, light of the three primary colors (red (R), green (G), and blue (B)) is emitted using one of the methods shown in FIGS. 7(a) to 7(c).

In the method shown in FIG. 7(a), a white luminescent medium 26 which emits white light is provided between a first electrode 22 and a second electrode 24, and light emitted from the white luminescent medium 26 is caused to pass through a red filter 28 which transmits only red light and blocks green light and blue light, a green filter 30 which transmits only green light and blocks red light and blue light, and a blue filter 32 which transmits only blue light and blocks red light and green light to obtain the RGB colors.

In the method shown in FIG. 7(b), a red luminescent medium 34 which emits red light, a green luminescent medium 36 which emits green light, and a blue luminescent medium 38 which emits blue light are disposed in parallel between the first electrode 22 and the second electrode 24 to obtain the RGB colors.

In the method shown in FIG. 7(c), the blue luminescent medium 38 is provided between the first electrode 22 and the second electrode 24, and light emitted from the blue luminescent medium 38 is caused to pass through a red fluorescent film 40 which converts the blue light into red light, a green fluorescent film 42 which converts the blue light into green light, and a blue filter 44 which adjusts the color of the light emitted from the blue luminescent medium to obtain the RGB colors.

The white luminescent medium 26 shown in FIG. 7(a) may be formed by disposing emitting layers of at least two colors in parallel between the first electrode 22 and the second electrode 24. The white luminescent medium 26 may also be formed by stacking emitting layers of at least two colors between the first electrode 22 and the second electrode 24.

However, these known technologies cannot realize a highly efficient emitting device which can be applied as a surface light source.

The inventors of the inventior conducted extensive studies on the reasons why a highly efficient emitting device cannot be obtained. As a result, the inventors found a fundamental problem of an emitting device. Specifically, the intensity of light from the luminescent medium out coupled in the front direction of the device is decreased due to high intensity of light components propagated in the direction parallel to the two electrodes and the total reflected components at the interface between a transparent substrate and air on the light-out coupling side. It was found from measurement of the total quantity of light that the amount of loss reached 70 to 80%.

In an emitting device shown in FIG. 8, a first electrode 22, a luminescent medium 48, and a second electrode 24 are stacked in this order on a supporting substrate 46, for example. A luminescent material in the luminescent medium 48 emits light in all directions. Only the light emitted in a light-out coupling direction A is out coupled through the supporting substrate 46. Part of the light emitted in the light-out coupling direction A is converted by a fluorescent film 50 into light having a different wavelength and then out coupled.

However, the light emitted in the directions other than the light-out coupling direction A, such as directions X and Y parallel to the supporting substrate 46, cannot be out coupled from the device and utilized. Moreover, part of the light emitted in the light-out coupling direction A is reflected (not shown) by the substrate 46 and the like and cannot be utilized. Therefore, such a device exhibits insufficient emission efficiency with the above-mentioned large amount of loss.

In view of the above circumstances, the invention was made and an object thereof is to provide a composite emitting device with a high efficiency.

In order to attain the object, the inventors found through extensive studies a novel device capable of emitting light with a high efficiency by utilizing the loss not out coupled in the front direction.

DISCLOSURE OF THE INVENTION

According to the invention, the following composite emitting device is provided.

(1) A composite emitting device comprising:
a supporting substrate,
a first emitting part comprising a first electrode, a luminescent medium, and a second electrode stacked in this order on the supporting substrate, and
a second emitting part comprising a fluorescent film arranged in a direction different from the light-out coupling direction relative to the luminescent medium,
the luminescent medium emitting light by applying a voltage between the first electrode and the second electrode in the first emitting part, and
the fluorescent film of the second emitting part absorbing light emitted from the luminescent medium to emit light.

(2) The composite emitting device according to (1),
wherein the supporting substrate and the first electrode are transparent,
the second electrode has light-reflecting properties, and
the light emitted from the first emitting part and the second emitting part is out coupled from the supporting substrate side.

(3) The composite emitting device according to (1),
wherein the first electrode has light-reflecting properties,
the second electrode is transparent, and
the light emitted from the first emitting part and the second emitting part is out coupled from a side opposite to the supporting substrate.

(4) The composite emitting device according to any one of (1) to (3), further comprising:
a third emitting part comprising a fluorescent film different from the fluorescent film of the second emitting part, the third part being arranged relative to the luminescent medium in a direction different from the light-out coupling direction,
the fluorescent film of the third emitting part absorbing light emitted from the luminescent medium to emit light.

(5) The composite emitting device according to (4), wherein the first emitting part constitutes a blue pixel, the first emitting part and the second emitting part constitute a green pixel, and the first emitting part and the third emitting part constitute a red pixel.

(6) The composite emitting device according to any one of (1) to (5), wherein the first electrode, the luminescent medium, and the second electrode are stacked in the light-out coupling direction or a direction opposite to the light-out coupling direction, and at least one fluorescent film of the second emitting part and the third emitting part is arranged in a direction substantially perpendicular to the light-out coupling direction relative to the luminescent medium.

(7) The composite emitting device according to (6), wherein at least one of the fluorescent films of the second emitting part and the third emitting part is arranged in a direction substantially perpendicular to the light-out coupling direction and the light-out coupling direction relative to the luminescent medium.

(8) The composite emitting device according to any one of (1) to (7), wherein at least one of the fluorescent films of the second emitting part and the third emitting part surrounds the luminescent medium.

At least one of the fluorescent films of the second emitting part and the third emitting part surrounds all or part of the luminescent medium.

(9) The composite emitting device according to any one of (1) to (8) wherein combined light of the light emitted from the first emitting part and the second emitting part, or the first emitting part, the second emitting part, and the third emitting part is white.

(10) The composite emitting device according to any one of (1) to (9), wherein the luminescent medium is an organic luminescent medium.

According to the invention, a highly efficient composite emitting device can be provided.

DESCRIPTION OF THE PREFERRED EMBODIMENTS

The invention is described below with reference to the drawings.

First Embodiment

Figure 1:
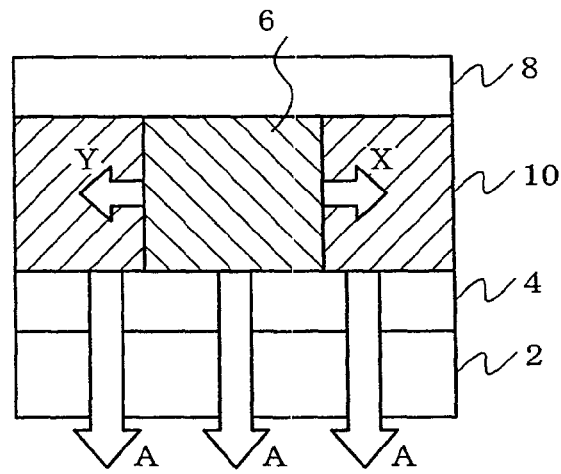
FIG. 1 is a view showing a composite emitting device according to a first embodiment of the invention.

FIG. 1 is a view showing a composite emitting device according to one embodiment of the invention.

In FIG. 1, the reference numeral 2 indicates a transparent supporting substrate, the reference numeral 4 indicates a transparent electrode (first electrode), the reference numeral 6 indicates an organic luminescent medium (luminescent medium), the reference numeral 8 indicates a reflecting electrode (second electrode), and the reference numeral 10 indicates a fluorescent film. The composite emitting device includes a first emitting part in which the transparent electrode 4, the organic luminescent medium 6, and the reflecting electrode 8 are stacked on the supporting substrate 2 in this order in the light-out coupling direction A, and a second emitting part including the fluorescent film 10 arranged adjacent to the first emitting part in the directions X and Y (directions substantially perpendicular to the light-out coupling direction A).

The operation of the composite emitting device is described below.

In the first emitting part, the organic luminescent medium 6 emits light by applying a voltage between the transparent electrode 4 and the reflecting electrode 8. In the second emitting part, the fluorescent film 10 absorbs the light emitted from the first emitting part in the directions (e.g. directions X and Y) other than the light-out coupling direction A and the light entering the second emitting part as a result of reflection to emit light. The light emitted from the first emitting part and the second emitting part in the light-out coupling direction A is emitted through the supporting substrate 2.

In the first embodiment, light is out coupled through the supporting substrate 2 with the transparent supporting substrate 2, the transparent electrode 4 and the light-reflecting electrode 8 (bottom emission type). Note that light may be out coupled from the side opposite to the supporting substrate 2 (transparent electrode 8 side) by changing the transparent electrode 4 to a light-reflecting electrode 4 and changing the reflecting electrode 8 to a transparent electrode 8 (top emission type).

In the first embodiment, the fluorescent film 10 contacts the organic luminescent medium 6. Note that another member may be provided between the fluorescent film 10 and the organic luminescent medium 6 insofar as light can be transmitted.

As an example of the other member, a gas barrier layer can be given. The fluorescent film 10 may be formed of a resin film in which a fluorescent material is dispersed, as described later. A fluorescent film having such a composition contains volatile components such as water and residual monomers. Since the volatile components may accelerate deterioration of the organic luminescent medium 6, it may be effective to dispose a gas barrier layer at the boundary between the fluorescent film 10 and the organic luminescent medium 6.

Second Embodiment

Figure 2:
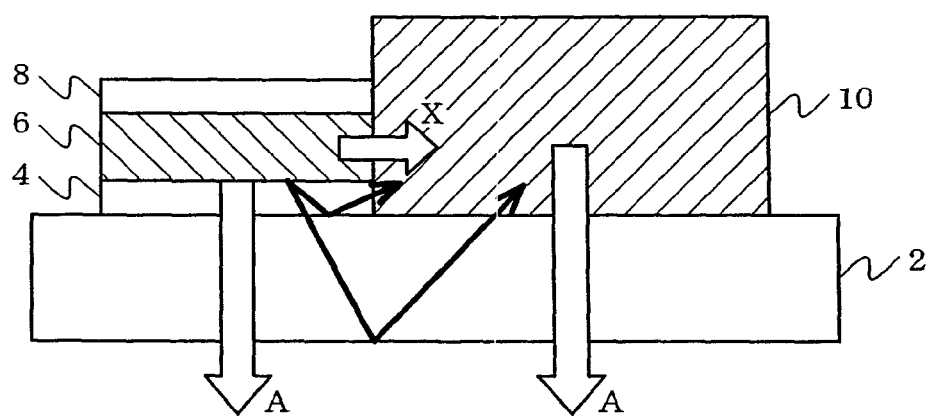
FIG. 2 is a view showing a composite emitting device according to a second embodiment of the invention.

FIG. 2 is a view showing a composite emitting device according to another embodiment of the invention.

In the following embodiments, the same members as shown in FIG. 1 are indicated by the same symbols. Description of these members is omitted.

In the composite emitting device according to the first embodiment, both the organic luminescent medium 6 and the fluorescent film 10 are placed between the transparent electrode 4 and the reflecting electrode 8. In the second embodiment, a fluorescent film 10 is not placed between a transparent electrode 4 and a reflecting electrode 8.

Specifically, as shown in FIG. 2, a first emitting part including a transparent electrode 4, an organic luminescent medium 6, and a reflecting electrode 8 and a second emitting part including a fluorescent film 1C are disposed on a supporting substrate 2.

In the device according to the second embodiment, the thickness of the fluorescent film 10 is increased in order to increase the conversion efficiency of the fluorescent film 10. As shown in FIG. 2, light emitted from the organic luminescent medium 6 directly enters the fluorescent film 10, and indirectly enters the fluorescent film 10 after being reflected by the electrode 4 and the supporting substrate 2.

Third Embodiment

Figure 3:
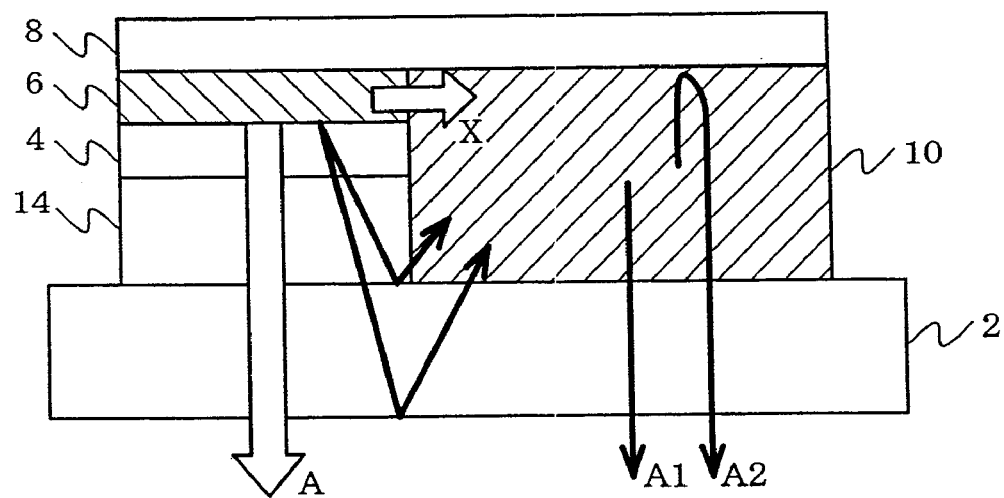
FIG. 3 is a view showing a composite emitting device according to a third embodiment of the invention.

FIG. 3 is a view showing a composite emitting device according to still another embodiment of the invention.

In the device according to the third embodiment, a first emitting part including a transparent insulating film 14, a transparent electrode 4, an organic luminescent medium 6, and a reflecting electrode 8, and the second emitting part including a fluorescent film 10 and a reflecting electrode 8 are disposed on a supporting substrate 2. The thickness of the fluorescent film 10 is increased in order to increase the conversion efficiency of the fluorescent film 10 like the second embodiment.

As shown in FIG. 3, the back (upper) surfaces of the organic luminescent medium 6 and the fluorescent film 10 are made even by forming the transparent insulating film 14 between the transparent electrode 4 and the Supporting substrate 2. Specifically, the thickness of the transparent insulating film 14 is adjusted so that the thickness of the fluorescent film 10 is equal to the total thickness of the transparent insulating film 14, the transparent electrode 4, and the organic luminescent medium 6. The reflecting electrode 8 is provided to extend over the fluorescent film 10.

Figure 8:
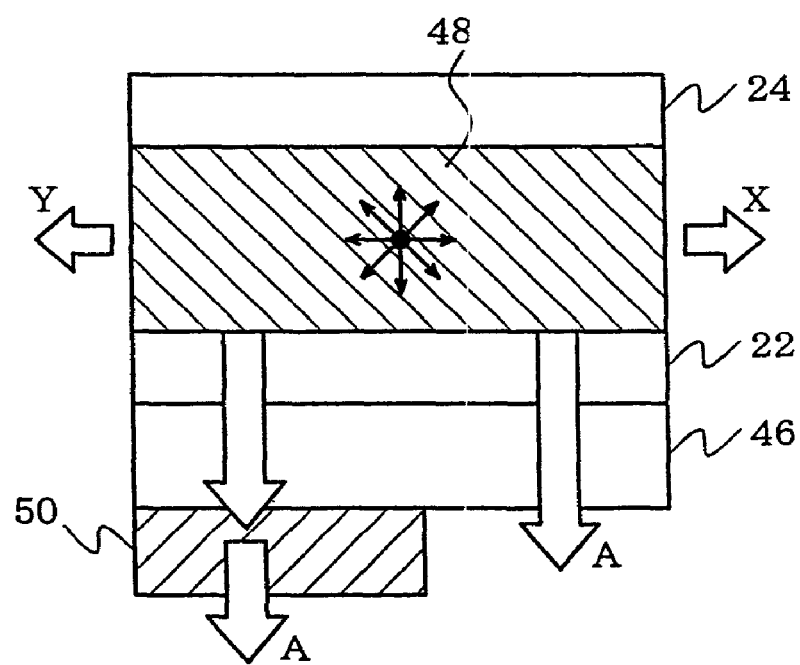
FIG. 8 is a view showing a known emitting device.

The fluorescent film 10 receives light emitted from the organic luminescent medium 6 in the direction X, light which enters the fluorescent film 10 as a result of reflection, and the like, and emits light in all directions, as shown in FIG. 8. For example, a light component A1 emitted in the light-out coupling direction A is directly out coupled to the outside, and a light component A2 emitted in the direction opposite to the light-out coupling direction A is reflected by the reflecting electrode 8 and then out coupled to the outside.

Therefore, since the light component reflected by the reflecting electrode 8 can be out coupled by providing the reflecting electrode 8 on the back surface of the fluorescent film 10, this device allows the emission intensity of the second emitting part to be increased in comparison with the device according to the second embodiment.

Fourth Embodiment

Figure 4:
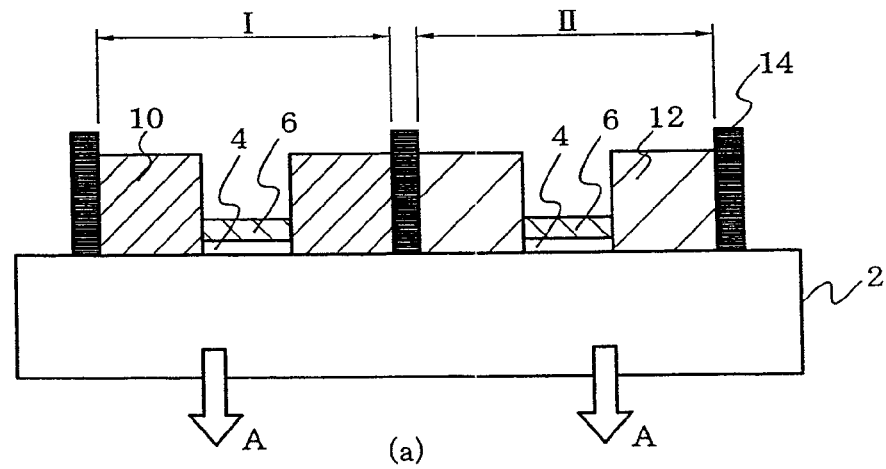
FIG. 4 is a view showing a composite emitting device according to a fourth embodiment of the invention.
Figure 4:
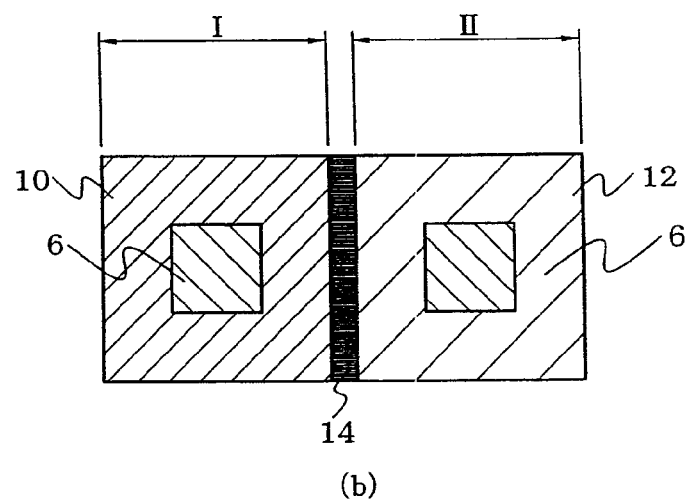
Figure 4:
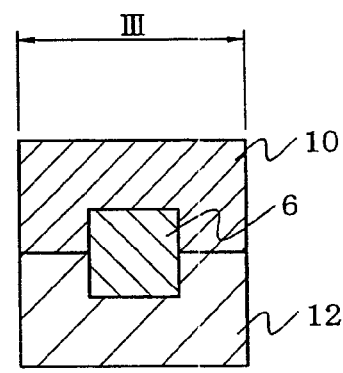

FIG. 4 is a view showing a composite emitting device according to still another embodiment of the invention.

FIG. 4(a) is across-sectional view of a composite emitting device, and FIG. 4(b) is a plane view of the composite emitting device shown in FIG. 4(a). In these drawings, the second electrode is omitted.

In the fourth embodiment, a second emitting part is formed to surround a first emitting part. Specifically, a fluorescent film 10 of a second emitting part surrounds an organic luminescent medium 6 of a first emitting part.

In the fourth embodiment, a third emitting part including a fluorescent film 12 is addition ally provided.

A pixel I is formed of the first emitting part and the second emitting part which surrounds the first emitting part, and a pixel II is formed of the first emitting part and the third emitting part which surrounds the first emitting part. Since the pixels I and II are isolated by a partition wall 14, different light components emitted from the pixels I and II are not mixed.

In the fourth embodiment, when the organic luminescent medium 6 is formed of a blue luminescent medium, the fluorescent film 10 is formed of a red fluorescent film, and the fluorescent film 12 is formed of a green fluorescent film, the first emitting part emits blue light, the second emitting part emits red light, and the third emitting part emits green light. Therefore, adjusting the area ratio of the pixels I and II allows the following light emission. Magenta light of mixed blue light and red light is out coupled if the organic luminescent medium 6 of only the pixel I emits light. Sky blue light of mixed blue light and green light is out coupled if the organic luminescent medium 6 of only the pixel II emits light. White light of mixed three colors is out coupled if the organic luminescent media 6 of both the pixels I and II emits light.

Note that a pixel III shown in FIG. 4(c) only may be formed by combining the pixels I and II. In the case where the organic luminescent medium 6 is formed of a blue luminescent medium, the fluorescent film 10 is formed of a red fluorescent film, and the fluorescent film 12 is formed of a green fluorescent film, the first emitting part emits a blue light component, the second emitting part emits a red light component, and the third emitting part emits a green light component when the organic luminescent medium 6 emits light, whereby white light of mixed the blue light, red light, and green light can be out coupled from the pixel III.

Fifth Embodiment

Figure 5:
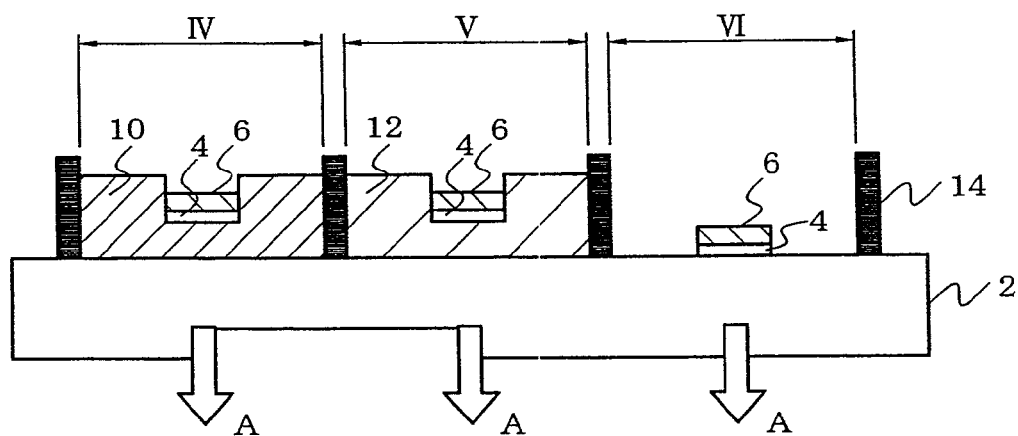
FIG. 5 is a view showing a composite emitting device according to a fifth embodiment of the invention.

FIG. 5 is a view showing a composite emitting device according to yet another embodiment of the invention.

In the fifth embodiment, the fluorescent films 10 and 12 provided in the pixels I and II according to the fourth embodiment respectively surround the side surfaces and the bottom surface (directions substantially perpendicular to the light-out coupling direction A and the light-out coupling direction A) of the organic luminescent medium 6 to form pixels IV and V. A pixel VI including only the organic luminescent medium 6 is also formed.

In the fifth embodiment, since all light emitted from the organic luminescent medium 6 in the pixels IV and V is out coupled through the fluorescent films 10 and 12, differing from the fourth embodiment. Only the light converted by the fluorescent films 10 and 12 is out coupled from the pixels IV and V. Light emitted from the organic luminescent medium 6 is out coupled as it is from the pixel VI.

Therefore, when the organic luminescent medium 6 is formed of a blue luminescent medium, the fluorescent film 10 is formed of a red fluorescent film, and the fluorescent film 12 is formed of a green fluorescent film, red light is out coupled from the pixel IV, green light is out coupled from the pixel V, and blue light is out coupled from the pixel VI.

This allows a full color display using the three colors.

In the first to third embodiments, the first emitting part emits blue light having a peak wavelength of preferably 500 nm or less, and still more preferably 480 nm or less, and the second emitting part emits yellow, orange, or red light having a peak wavelength of preferably 550 nm or more, and still more preferably 570 nm or more.

In the fourth and fifth embodiments, the first emitting part emits blue light having a peak wavelength of preferably 500 nm or less, and still more preferably 480 nm or less, the second emitting part emits green light having a peak wavelength of preferably 500 to 600 nm, and still more preferably 510 to 550 nm, and the third emitting part emits red light having a peak wavelength of preferably 600 nm or more, and still more preferably 610 nm or more.

In the above embodiments, it is preferable to adjust the area ratio of the first emitting part and the second emitting part or the area ratio of the first emitting part, the second emitting part, and the third emitting part so that the combined light of the light components emitted from all the emitting parts is white.

Members used in the above embodiments will be described below.

1. Supporting Substrate

The supporting substrate is a member for supporting the first and second emitting parts. It is therefore preferred that the mechanical strength and the dimensional stability thereof are superior.

Examples of such a substrate are substrates made of an inorganic material, such as a glass plate, a metal plate, and a ceramic plate. Preferred examples of the inorganic material include glass material, silicon oxide, aluminum oxide, titanium oxide, yttrium oxide, germanium oxide, zinc oxide, magnesium oxide, calcium oxide, strontium oxide, barium oxide, lead oxide, sodium oxide, zirconium oxide, sodium oxide, lithium oxide, boron oxide, silicon nitride, soda lime glass, barium/strontium-containing glass, lead glass, aluminosilicate glass, borosilicate glass, and barium borosilicate glass.

Preferred examples of an organic material constituting the substrate include polycarbonate resin, acrylic resin, vinyl chloride resin, polyethylene terephthalate resin, polyimide resin, polyester resin, epoxy resin, phenol resin, silicone resin, fluorine resin, polyvinyl alcohol resin, polyvinyl pyrrolidone resin, polyurethane resin, epoxy resin, cyanate resin, melamine resin, maleic resin, vinyl acetate resin, polyacetal resin and cellulose resin.

In the type of out coupling light through a supporting substrate, a transparent substrates is used. Preferably, the substrate transmits 50% or more of light in a visible region of 400 to 700 nm. More preferably it is flat and smooth. For example, as such transparent substrate, glass substrates and synthetic resin substrates may be preferably used. Glass substrates include ones made of soda-lime glass, barium/strontium-containing glass, lead glass, aluminosilicate glass, borosilicate glass, barium borosilicate glass, and quartz. Synthetic resin substrates include ones made of polycarbonate resins, acrylic resins, polyethyleneterephthalate resins, polyethersulfide resins and polysulfone resins.

2. Transparent Electrode (First Electrode)

For the first electrode, transparent electrode materials of transparent conductive materials may be used. In order to efficiently out couple light emitted from an emitting layer, the transparent electrode may be formed of materials with a transparency of 10% or more, preferably 60% or more. Specific Materials include only one or combinations of two or more selected from indium tin oxide (ITO), indium zinc oxide (IZO), copper indium (CuIn), tin oxide ($SnO_2$), zinc oxide (ZnO), antimony oxide ($Sb_2O_3$, $Sb_2O_4$, $Sb_2O_5$), aluminum oxide ($Al_2O_3$) and so on. In order to decrease the resistance thereof without damaging transparency, only one or combination of two or more selected from metals such as Pt, Au, Ni, Mo, W, Cr, Ta and Al is preferably added.

When using the first electrode as the cathode, a low-work-function layer formed of a low-work-function material for injecting electrons into an organic emitting layer may be used together. As the material for the low-work-function layer, a material having a small work function, for example less than 4.0 eV, is used due to easy electron injection. It is preferable to form the low-work-function layer on an organic luminescent medium to such a reduced thickness that the low-work-function layer exhibits sufficient transparency, and to stack the transparent electrode on the low-work-function layer. This is because it is difficult to use a transparent oxide conductor such as ITO or ZnO as the cathode, since such a transparent oxide conductor has a work function of 4.6 eV or more.

As the low-work-function material, a metal such as aluminum, barium, calcium, cerium, erbium, europium, gadolinium, hafnium, indium, lanthanum, magnesium, silver, manganese, neodymium, scandium, samarium, yttrium, zinc, or zirconium, or an alloy of such a metal and another metal may be used. In particular, magnesium, silver, or an alloy of magnesium and silver is preferably used.

The first electrode may be formed by a method capable of making film-deposition in a dry state, such as vacuum deposition, sputtering, ion plating, electron beam evaporation, CVD (chemical vapor deposition), MOCVD (metal oxide chemical vapor deposition), or plasma CVD.

The thickness of the transparent electrode is 5 to 1000 nm, and preferably 10 to 500 nm, although it is not limited thereto. The thickness of the low-work-function layer is 1 to 100 nm, preferably 0.5 to 50 nm, and still more preferably 5 to 30 nm, although it is not limited thereto. If the thickness of each member exceeds the upper limit, light emitted from an organic emitting layer may not be efficiently out coupled. If the thickness of each member is less than the lower limit, damage to an organic emitting layer may not be prevented when forming the transparent electrode layer.

3. Reflecting Electrode (Second Electrode)

The second electrode is a reflecting electrode which reflects light, and is not required to exhibit transparency. In the invention, the device configuration may be either a configuration in which the reflecting electrode is the anode and the transparent electrode is the cathode and a configuration in which the reflecting electrode is the cathode and the transparent electrode is the anode.

When using the second electrode as the anode, a metal having a work function required for hole injection is used. It is preferable that the metal used for the second electrode have a work function of 4.6 eV or more. As specific examples of such a metal, metals such as gold, silver, copper, iridium, molybdenum, niobium, nickel, osmium, palladium, platinum, ruthenium, tantalum, tungsten, and aluminum, alloys thereof, metal oxides such as indium and/or tin oxide (hereinafter abbreviated as "ITO"), copper iodide, conductive polymers such as polypyrrole, polyaniline, and poly(3-methylthiophene), and laminates thereof can be given.

When using the second electrode as the cathode, a metal, an alloy, an electrically conductive compound, and a mixture thereof, having a small work function (less than 4.0 eV), is used as an electrode material. Specific examples of such an electrode material include one or a combination of two or more selected from sodium, sodium-potassium alloy, magnesium, lithium, magnesium-silver alloy, aluminum-aluminum oxide, aluminum-lithium alloy, indium, and rare earth metals.

4. Organic Luminescent Medium (Luminescent Medium)

The organic luminescent medium is defined as a medium containing an organic emitting layer wherein electrons and holes are recombined with each other so that EL can be emitted. This organic luminescent medium can be made, for example, by stacking the following layers on an anode:

(a) organic emitting layer (b) hole injection layer/organic emitting layer (c) organic emitting layer/electron injection layer (d) hole injection layer/organic emitting layer/electron injection layer (e) organic semiconductor layer/organic emitting layer (f) organic semiconductor layer/electron barrier layer/organic emitting layer (g) hole injection layer/organic emitting layer/adhesion improving layer Among these, the structure (d) is preferably used since it can give a higher luminance and is also superior in durability.

Examples of the luminescent material for the organic emitting layer in the organic luminescent medium include one or a combination of two or more selected from p-quaterphenyl derivatives, p-quinquphenyl derivatives, benzothiazole compounds, benzoimidazole compounds, benzoxazole compounds, metal-chelated oxinoid compounds, oxadiazole compounds, styrylbenzene compounds, distyrylpyrazine derivatives, butadiene compounds, naphthalimide compounds, perylene derivatives, aldazine derivatives, pyrazine derivatives cyclopentadiene derivatives, pyrrolopyrrole derivatives, styrylamine derivatives, coumarin compounds, aromatic dimethylidyne compounds, metal complexes having a ligand of a 8-quinolynol derivative, and polyphenyl compounds.

Among these organic luminescent materials, 4,4'-bis(2,2-di-t-butylphenylvinyl)biphenyl (abbreviated to DTBPBBi) and 4,4'-bis(2,2-diphenylvinyl) biphenyl (abbreviated to DPVBi) as aromatic dimethylidyne compounds, and derivatives thereof are more preferred.

Furthermore, it is preferred to use together a material wherein an organic luminescent material having a distyrylarylene skeleton or the like, as a host material, is doped with a fluorescent dye giving intense blue and red fluorescence, for example, a coumarin material, or a fluorescent dye similar to the host, as a dopant. More specifically, it is preferred to use the above-mentioned DPVBi or the like as a host and use N,N-diphenylaminobenzene (abbreviated to DPAVB) as a dopant.

Compounds having a hole mobility of $1\times10^{-6}$ cm$^2$/Vs or more measured at an applied voltage of $1\times10^4$ to $1\times10^6$ V/cm and an ionization energy of 5.5 eV or Less are preferably used in a hole injecting layer of an organic luminescent medium. Such a hole injecting layer enables good hole injection into an organic emitting layer, thereby enhancing a luminance or allowing low voltage drive.

Examples of such a constituent material for the hole injection layer include porphyrin compounds, aromatic tertiary amine compounds, styrylamine compounds, aromatic dimethylidine compounds, condensed aromatic ring compounds and organic compounds such as 4,4'-bis[N-(1-naphthyl)-N-phenylamino]biphenyl (abbreviated to NPD) and 4,4',4"-tris[N-(3-methylphenyl)-N-phenylamino]triphenylamine (abbreviated to MTDATA).

Inorganic compounds such as p-type Si and p-type SiC are preferably used as a constituent material for the hole injection layer. It is also preferred that an organic semiconductor layer having an electrical conductivity of $1\times10^{-10}$ S/cm or more is formed between the above hole injecting layer and anode, or between the above hole injecting layer and organic emitting layer. Such an organic semiconductor layer enables better hole injection into an organic emitting layer.

Compounds having an electron mobility of $1\times10^{-6}$ cm$^2$/V or more measured at an applied voltage of $1\times10^4$ to $1\times10^6$ V/cm and an ionization energy more than 5.5 eV are preferably used in an electron injecting layer of an organic luminescent medium. Such an electron injecting layer enables good electron injection into an organic emitting layer, thereby enhancing a luminance or allowing low voltage drive. Examples of a constituent material for the electron injecting layer include metal complexes of 8-hydroxyxinoline (Al chelate: Alq), derivatives thereof or oxadiazole derivatives.

An adhesion improving layer in an organic luminescent medium is one kind of the electron injecting layer. That is, it is a layer comprising a material with good adhesion properties to a cathode among electron injecting layers. The adhesion improving layer is preferably made of metal complexes of 8-hydroxyxinoline or derivatives thereof. It is also preferred that an organic semiconductor layer with an electric conductivity of $1\times10^{-10}$ S/cm or more is formed in contact with the above electron injecting layer. Such an organic semiconductor layer enables good electron injecting into an organic emitting layer.

The thickness of the organic luminescent medium is preferably 5 nm to 5 µm. If the thickness is below 5 nm, the luminance and durability thereof may deteriorate, while if it exceeds 5 µm, an applying voltage may become high. Therefore, the thickness of the organic emitting layer is more preferably 10 nm to 3 µm, and still more preferably 20 nm to 1 µm.

A method for forming the organic luminescent medium is not limited. It may be formed by any known methods such as a vacuum deposition method, molecular beam deposition (MBE) method, dipping method, spin coating method, and casting method, bar coat method, and roll coat method.

5. Fluorescent Film

The fluorescent layer has a function of absorbing light from the organic luminescent medium to give fluorescence having a longer wavelength. The fluorescent layer and color filter may be stacked in combination for good color reproducibility. The stacked layers may be used as the fluorescent film.

The constituent material of the fluorescent film is, for example, a fluorescent material and a resin, or only a fluorescent material. The fluorescent material and the resin may be solid where a fluorescent material is dissolved or dispersed in a binder resin.

As a specific example of the fluorescent material, an organic fluorescent dye is described below. Examples of a fluorescent dye for changing near-ultra violet to violet light emitted from the organic EL device to blue light include stilbene dyes such as 1,4-bis(2-methylstyryl)benzene (Bis-MBS) and trans-4,4'-diphenylstilbene (DPS) and coumarin dyes such as 7-hydroxy-4-methylcoumarin (coumarin 4). Examples of a fluorescent dye for changing blue, bluish green or white light emitted from the organic EL device to green light include coumarin dyes such as 2,3,5,6-1H,4H-tetrahydro-8-trifluoromethylquinolidino(9,9a,1-gh)coumarin (coumarin 153), 3-(2'-benzothiazolyl)-7-diethylaminocoumarin (coumarin 6) and 3-(2'-benzimidazolyl)-7-N,N-diethylaminocoumarin (coumarin 7); Basic Yellow 51, which is a coumarin type dye; and naphthalimide dyes such as Solvent Yellow 11 and Solvent Yellow 116. Examples of a fluorescent dye for changing blue to green light or white light emitted from the organic EL device to orange to red light include cyanine dyes such as 4-dicyanomethylene-2-methyl-6-(p-dimethylaminostyryl)-4H-pyran (DCM); pyridine dyes such as 1-ethyl-2-(4-(p-dimethylaminophenyl)-1,3-butadienyl)-pyridinium-perchlorate (pyridine 1); rhodamine dyes such as Rhodamine B and Rhodamine 6G; and oxadine dyes. Various dyes (direct dyes, acidic dyes, basic dyes, disperse dyes and soon) can be selected as fluorescent dyes if they have fluorescent properties. The fluorescent dye that has been beforehand kneaded into a pigment resin may be used. Such pigment resins include polymethacrylic acid esters, polyvinyl chlorides, vinyl chloride vinyl acetate copolymers, alkyd resins, aromatic sulfonamide resins, urea resins, melamine resins and benzoguanamine resins.

Inorganic fluorescent fine particles can also be used as a fluorescent dye. Fine particles may be used as the fluorescent particles which are made of inorganic materials such as metallic compounds and absorb visible light to emit fluorescence longer than visible light. The surface of the particles may be decorated with organic materials such as long-chain alkyl groups and phosphoric acid to improve their dispersibility into a matrix resin described later. Specifically metal oxides doped with transition metal ions can be used. There are exemplified metal oxides such as $Y_2O_3$, $Gd_2O_3$, ZnO, $Y_2Al_5O_{12}$ and $Zn_2SiO_4$ doped with transition metal ions that absorb visible light such as $Eu^{2+}$, $Eu^{3+}$, $Ce^{3+}$ and $Tb^{3+}$. Metal chalcogenides doped with transition metal ions can also be used. There are exemplified metal chalcogenides such as ZnS, CdS and CdSe doped with transition metal ions that absorb visible light such as $Eu^{2+}$, $Eu^{3+}$, $Ce^{3+}$ and $Tb^{3+}$. The surface may be decorated with, for example, organic materials and metal oxides such as silica to prevent the removal of S, Se and the like by a reactive component of a matrix resin described later. Materials that absorb visible light to emit light by using the band gap of semiconductors can also be used. There are exemplified semiconductor fine particles such as CdS, CdSe, CdTe, ZnS, ZnSe and InP. As described in JP-A-2002-510866 and the like, they are shrinked down to nanosize to control their band gap, thereby changing their absorption wavelength and fluorescent wavelength. The surface may be decorated with, for example, organic materials and metal oxides such as silica to prevent the removal of S, Se and the like by a reactive component of a matrix resin described later.

The binder resin is a resin in which the fluorescent material is dispersed. As the binder resin, a non-curable resin, a heat-curable resin, or a photo-curable resin may be used. Specific examples of the binder resin include a melamine resin, a phenol resin, an alkyd resin, an epoxy resin, a polyurethane resin, a maleic resin, and a polyamide resin, in the form of either an oligomer or a polymer, polymethyl methacrylate, polyacrylate, polycarbonate, polyvinyl alcohol, polyvinylpyrrolidone, hydroxyethylcellulose, carboxymethylcellulose, and the like. These resins may be used either individually or in combination of two or more. A photo-curable resin may be used to pattern the fluorescent film. As the photo-curable resin, a photo-polymerizable resin generally containing a photo-sensitizer, such as an acrylic acid or methacrylic acid based resin containing a reactive vinyl group, a photo-crosslinkable resin such as polyvinyl cinnamate, or the like may be used. A heat-curable resin may be used when a photo-sensitizer is not used. As the binder resin, one resin may be used individually, or two or more resins may be used in combination. In the invention, fluorescent films may be separately disposed in a plane. Therefore, a photo-sensitive resin to which photolithography can be applied is preferably used as the binder resin.

6. Partition Wall

A partition wall is to isolate the pixels I and II to prevent different light components emitted from these pixels from being mixed in FIG. 4(a) which is illustrative of the fourth embodiment. The partition wall may be obtained by dissolving or dispersing a black dye or a metal material in a binder resin similar to that used for the fluorescent film to a solid state and patterning the resulting solid mixture.

As specific examples of the material for the partition wall, the following metals and black dyes can be given. As examples of the metal, at least one metal selected from Ag, Al, Au, Cu, Fe, Ge, In, K, Mg, Ba, Na, Ni, Pb, Pt, Si, Sn, W, Zn, Cr, Ti, Mo, Ta, stainless steel, and the like, and alloys thereof can be given. An oxide, nitride, sulfide, nitrate, sulfate, or the like of the above-mentioned metal may also be used. In addition, the material may contain carbon as required.

A film is formed from the above material on a desired substrate by sputtering, deposition, CVD, ion plating, electrodeposition, electroplating, chemical plating, or the like, and patterned by photolithography or the like to form a pattern separately disposed in a plane.

As examples of the black dye, carbon black, titanium black, aniline black, and a black dye obtained by mixing dyes of single color such as red, green or blue, can be given. The black dye or the metal material is dissolved or dispersed in the binder resin similar to that used for the fluorescent film to a solid state, and the resulting solid mixture is patterned in the same manner as the fluorescent film to form a partition wall pattern.

The thickness of the partition wall is 10 nm to 1 mm, preferably 1 μm to 1 mm, and still more preferably 10 μm to 100 μm, although the thickness of the partition wall is not limited thereto. The cross-sectional shape of the partition wall is usually quadrilateral. Note that the partition wall may have a reverse trapezoidal or T-shaped cross-sectional shape. It is preferable that the partition wall be transparent to light in the wavelength region of light emitted from the pixels I and II (i.e. visible region at a wavelength of 400 to 700 nm) of 10% or less, and still more preferably 1% or less. If the transparency of the partition wall exceeds 10%, light components emitted from the pixels I and II are mixed, whereby the viewing angle characteristics may deteriorate. The partition wall may be formed so that at least a side surface reflects light, if necessary.

The above description also applies to the partition wall used in the fifth embodiment.

7. Transparent Insulating Film

As the material for the transparent insulating film, a resin similar to the binder resin used for the fluorescent film may be used. Note that a transparent inorganic compound such as silicon oxide or silicon nitride oxide may also be used.

EXAMPLES

Example 1

Figure 6:
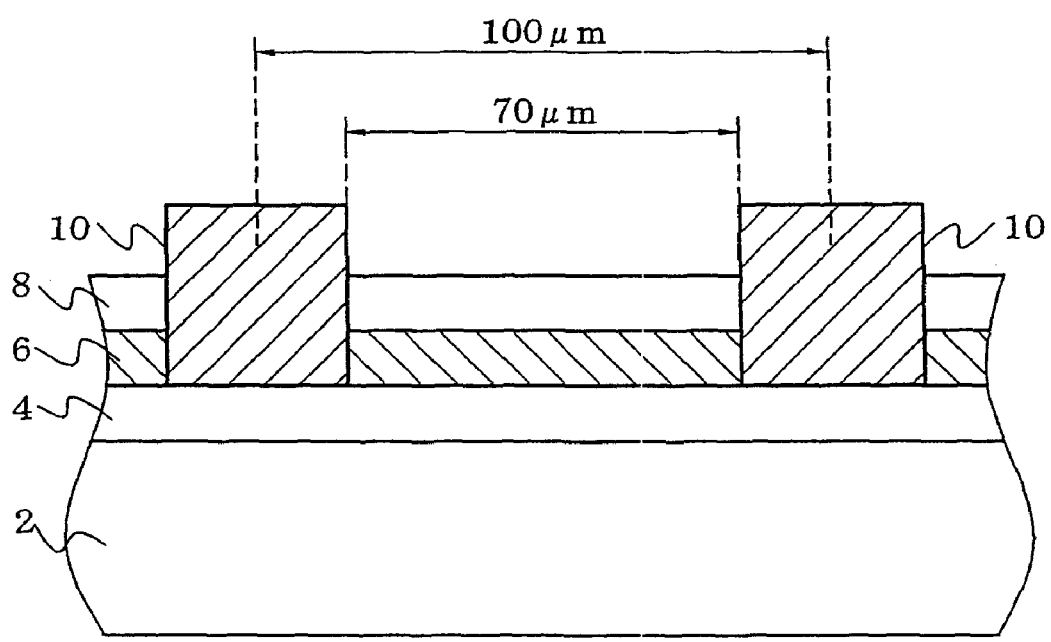
FIG. 6 is a view showing a composite organic EL device fabricated in Example 1.
Figure 7:
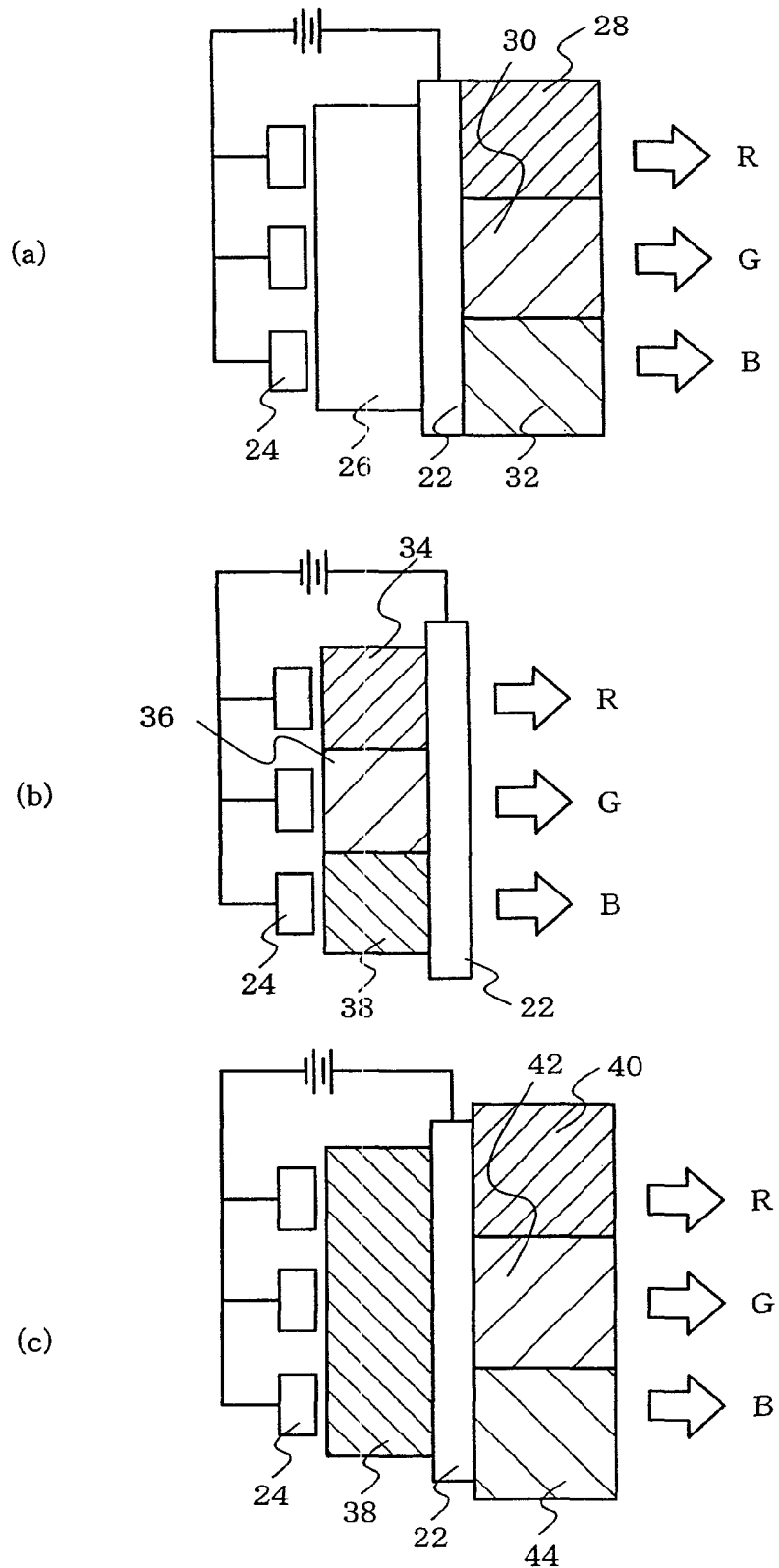
FIG. 7 is a view illustrative of methods of emitting light in the three primary colors (RGB) in a known emitting device.

A composite organic EL device shown in FIG. 6 was fabricated.

An ITO film 4 with a thickness of 140 nm was formed on a glass substrate 2 with dimensions of 75×25×0.7 mm.

Rhodamine 6G (fluorescent dye) was dissolved in a UV-curable resin to prepare ink for forming a fluorescent film. The resulting ink was applied to the ITO film 4 by spin coating. The applied ink was exposed/developed using a photomask so that a 70-micron square opening was formed inside a 100-micron square while allowing a frame with a width of 15 μm to remain, and then heated at 180° C. for one hour. The thickness of the resulting fluorescent film 10 was 5 μm.

After UV ozone cleaning, the substrate 2 was placed in a vacuum deposition equipment, and the atmosphere inside the device was evacuated. Then, α-NPD as a luminescent medium 6 (100 nm), Bu-PBD as a buffer layer (30 nm) (not shown), LiF as an electron injecting electrode 8 (1 nm), and Al (200 nm) were continuously deposited to form films.

A voltage of 7 V was applied between the ITO anode 4 and the Al cathode 8 of the resulting composite organic EL device. As a result, white light with a CIE chromaticity of (0.34, 0.26) and a luminance of 2308 nit was obtained. The current luminous efficiency of the device was 4.2 cd/A, and the power luminous efficiency was 3.58 μm/W.

Comparative Example 1

An organic EL device was fabricated in the same manner as in Example 1 except that Rhodamine 6G was not dissolved in the resin.

When a voltage of 7 V was applied between the ITO anode and the Al cathode, only blue light with a CIE chromaticity of (0.16, 0.10) and a luminance of 1710 nit was obtained. The current luminous efficiency of the device was 2.66 cd/A, and the power luminous efficiency was 2.34 μm/W.

Comparative Example 2

A fluorescent film with a thickness of 5 μm was formed over the glass substrate under the same conditions as in Example 1, and an ITO electrode was formed by sputtering.

Then, an organic layer (α-NPD layer) and an Al cathode were formed in the same manner as in Example 1 to obtain an organic EL device.

When a voltage of 7 V was applied between the ITO anode and the Al cathode, light with a CIE chromaticity (0.22, 0.18) was obtained. Specifically, the light obtained was blue deeper than the light obtained in Example 1. The luminance was as low as 1280 nit. The current luminous efficiency of the device was 2.13 cd/A, and the power luminous efficiency was 1.79 lm/W.

INDUSTRIAL APPLICABILITY

The composite emitting device according to the invention can be suitably used for a white surface light source, multicolor display, and the like.

What is claimed is:

1. A composite emitting device, comprising:
   a supporting substrate,
   a first emitting part comprising a first electrode, a luminescent medium, and a second electrode stacked in this order on the supporting substrate, and
   a second emitting part comprising a fluorescent film arranged in directions substantially perpendicular to a light-outcoupling direction and a light-outcoupling direction relative to the luminescent medium,
   the luminescent medium emitting light by applying a voltage between the first electrode and the second electrode in the first emitting part, and
   the fluorescent film of the second emitting part absorbing light emitted from the luminescent medium to emit light;
   wherein the fluorescent film of the second emitting part is not placed between the first electrode and the second electrode.

2. The composite emitting device according to claim 1, wherein pixels formed of the first emitting part and the second emitting part are isolated to one another by a partition wall.

3. The composite emitting device according to claim 1, which has a first pixel wherein the luminescent medium is formed of a blue luminescent medium and the fluorescent film is formed of a red fluorescent film, and a second pixel wherein the luminescent medium is formed of a blue luminescent medium and the fluorescent film is formed of a green fluorescent film.

4. The composite emitting device according to claim 3, which has a third pixel comprising the first electrode, a blue luminescent medium, and the second electrode stacked in this order on the supporting substrate.

5. The composite emitting device according to claim 1,
   wherein the supporting substrate and the first electrode are transparent,
   the second electrode has light-reflecting properties, and
   the light emitted from the first emitting part and the second emitting part is outcoupled from the supporting substrate side.

6. The composite emitting device according to claim 1,
   wherein the first electrode has light-reflecting properties,
   the second electrode is transparent, and
   the light emitted from the first emitting part and the second emitting part is outcoupled from a side opposite to the supporting substrate.

7. The composite emitting device according to claim 1, further comprising:
   a third emitting part comprising a fluorescent film different from the fluorescent film of the second emitting part, the third part being arranged relative to the luminescent medium in a direction different from the light-outcoupling direction,
   the fluorescent film of the third emitting part absorbing light emitted from the luminescent medium to emit light.

8. The composite emitting device according to claim 7, wherein the first emitting part constitutes a blue pixel, the first emitting part and the second emitting part constitute a green pixel, and the first emitting part and the third emitting part constitute a red pixel.

9. The composite emitting device according to claim 1, wherein the first electrode, the luminescent medium, and the second electrode are stacked in the light-outcoupling direction or a direction opposite to the light-outcoupling direction, and
   the fluorescent film of the second emitting part is arranged in a direction substantially perpendicular to the light-outcoupling direction relative to the luminescent medium.

10. The composite emitting device according to claim 7, wherein the first electrode, the luminescent medium, and the second electrode are stacked in the light-outcoupling direction or a direction opposite to the light-outcoupling direction, and
    at least one of the fluorescent films of the second emitting part and the third emitting part is arranged in a direction substantially perpendicular to the light-outcoupling direction relative to the luminescent medium.

11. The composite emitting device according to claim 1, wherein the fluorescent film of the second emitting part is arranged in a direction substantially perpendicular to the light-outcoupling direction and the light-outcoupling direction relative to the luminescent medium.

12. The composite emitting device according to claim 7, wherein at least one of the fluorescent films of the second emitting part and the third emitting part is arranged in a direction substantially perpendicular to the light-outcoupling direction and the light-outcoupling direction relative to the luminescent medium.

13. The composite emitting device according to claim 1, wherein the fluorescent film of the second emitting part surrounds the luminescent medium.

14. The composite emitting device according to claim 7, wherein at least one of the fluorescent films of the second emitting part and the third emitting part surrounds the luminescent medium.

15. The composite emitting device according to claim 1, wherein combined light of the light emitted from the first emitting part and the second emitting part is white.

16. The composite emitting device according to claim 7, wherein combined light of the lights emitted from the first emitting part, the second emitting part, and the third emitting part is white.

17. The composite emitting device according to claim 1, wherein the luminescent medium is an organic luminescent medium.

18. The composite emitting device according to claim 7, wherein the luminescent medium is an organic luminescent medium.

19. The composite emitting device according to claim 1, wherein the fluorescent film comprises a fluorescent material and a resin.

20. The composite emitting device according to claim 7, wherein the fluorescent film comprises a fluorescent material and a resin.

21. The composite emitting device according to claim 1, wherein the fluorescent film comprises a fluorescent material.

22. The composite emitting device according to claim 7, wherein the fluorescent film comprises a fluorescent material.

* * * * *